United States Patent
Hashimoto et al.

(10) Patent No.: US 9,118,262 B2
(45) Date of Patent: Aug. 25, 2015

(54) CONTROL METHOD FOR CONTRACT-TYPE GEL ACTUATOR AND CONTROL DEVICE

(75) Inventors: Minoru Hashimoto, Ueda (JP); Minami Shibagaki, Ueda (JP)

(73) Assignee: SHINSHU UNIVERSITY, Matsumoto (JP)

(*) Notice: Subject to any disclaimer, the term of this patent is extended or adjusted under 35 U.S.C. 154(b) by 184 days.

(21) Appl. No.: 13/993,949

(22) PCT Filed: Oct. 28, 2011

(86) PCT No.: PCT/JP2011/074927
§ 371 (c)(1),
(2), (4) Date: Jun. 13, 2013

(87) PCT Pub. No.: WO2012/081314
PCT Pub. Date: Jun. 21, 2012

(65) Prior Publication Data
US 2013/0264972 A1    Oct. 10, 2013

(30) Foreign Application Priority Data
Dec. 17, 2010    (JP) .................................. 2010-281235

(51) Int. Cl.
*H02N 2/06* (2006.01)
*B25J 9/10* (2006.01)
*H01L 41/193* (2006.01)

(52) U.S. Cl.
CPC .................. *H02N 2/06* (2013.01); *B25J 9/1095* (2013.01); *H02N 2/062* (2013.01); *H01L 41/193* (2013.01)

(58) Field of Classification Search
CPC ......... H02N 11/00; H02N 2/06; H02N 2/062; B25J 9/1095
USPC ........................................................ 318/116
See application file for complete search history.

(56) References Cited

U.S. PATENT DOCUMENTS

| 2003/0006676 A1 | 1/2003 | Smith et al. |
| 2012/0193560 A1* | 8/2012 | Ueno et al. ............... 251/129.06 |

FOREIGN PATENT DOCUMENTS

| JP | A-2-41685 | 2/1990 |
| JP | A-5-25316 | 2/1993 |

(Continued)

OTHER PUBLICATIONS

Fujii et al., "Influence of the plasticizer on the electrical deformation of PVC gel," *Polymer Preprints*, 2006, pp. 4557-4558, vol. 55, No. 2, Japan (w/ abstract).

(Continued)

*Primary Examiner* — Karen Masih
(74) *Attorney, Agent, or Firm* — Oliff PLC

(57) ABSTRACT

A method for controlling a displacement in the thickness direction of the contraction-type gel actuator having an effect of contraction in the thickness direction by applying a voltage between an anode and a cathode between which a gel which includes a dielectric polymeric material is interposed, which includes performing feedback control of an applied voltage, with a sampled value of a displacement when the applied voltage acts on the contraction-type gel actuator, according to the following equation (1):

$$E = kp(xd-x) + Ed \qquad (1)$$

In the equation, xd represents a target displacement of the contraction-type gel actuator; Ed represents an applied voltage with respect to the target displacement xd obtained by the linear approximation of the applied voltage and the displacement from a measured result of the displacement in accordance with the applied voltage of the contraction-type gel actuator; and kp represents a proportional gain.

10 Claims, 4 Drawing Sheets

(56) References Cited

FOREIGN PATENT DOCUMENTS

| JP | A-2000-101159 | 4/2000 |
|---|---|---|
| JP | A-2003-282982 | 10/2003 |
| JP | 2007-043851 A | 2/2007 |
| JP | A-2009-273204 | 11/2009 |
| JP | A-2010-74900 | 4/2010 |
| WO | 2010/095960 A1 | 8/2010 |

OTHER PUBLICATIONS

Yamano et al., "A Contraction Type Soft Actuator using Poly Vinyl Chloride Gel," *Proceedings of the 2008 IEEE International Conference an Robotics and Biomimetics*, Feb. 21-26, 2009, pp. 745-750, Bangkok, Thailand.

Ogawa et al., "Characteristic Evaluation of a Multilayered PVC Gel Actuator," *Proceedings of the 9$^{th}$ SICE (the Society of Instrument and Control Engineers) System Integration Division Annual Conference*, Dec. 5-7, 2008, pp. 283-284 (w/ abstract).

Ogawa et al., "Development of a Contraction-type PVC Gel Actuator—Effects of Composition and Electric Field-," *Proceedings of the 46$^{th}$ Hokuriku-Shinetsu Branch Regular Meeting of the Japan Society of Mechanical Engineers*, Jun. 7, 2009, pp. 415-416 (w/ abstract).

Ogawa et al., "Characteristics Evaluation of PVC Gel Actuators," *The 2009 IEEE/RSJ International Conference on Intelligent Robots and Systems*, Oct. 11-15, 2009, pp. 2898-2903, St. Louis, United States.

International Search Report issued in International Patent Application No. PCT/JP2011/074927 dated Nov. 22, 2011.

Jan. 27, 2015 Search Report issued in European Application No. 11849616.5.

\* cited by examiner (a)

(b)

CONTROL METHOD FOR CONTRACT-TYPE GEL ACTUATOR AND CONTROL DEVICE

TECHNICAL FIELD

The present invention relates to a control method for a contraction-type gel actuator and a control device therefor.

BACKGROUND ART

Recently, studies on human friendly robots have been actively conducted. In the course of such trends, development of small-size and light-weight next generation actuators made from a polymer material which could realize a soft movement and could be used as alternative driving sources to conventional motors, is now attracting attention. Among them, actuators comprising a PVC gel have an advantage that they are relatively easy to control due to a stable movement in the air by an electric field.

There is a contraction-type gel actuator that has a configuration in which a gel that is driven by an effect of electric field is sandwiched with a mesh-type anode and a foil-type cathode. When a voltage is applied between the electrodes, the gel is drawn into a gap of the mesh of the anode. Thereby, the actuator contracts (or shrinkages) in its thickness direction.

PRIOR ART DOCUMENT

Patent Document

[Patent Document] Japan Patent Publication JP 2009-273204 A1

Non-Patent Document

[Non-Patent Document 1] Polymer Preprints, Japan, Vol. 55, No. 2 pp. 4557-4558, 2006
[Non-Patent Document 2]
Proceedings of IEEE International Conference on Robotics and Biomimetics (ROBIO 2008), Bangkok, Thailand, pp. 745-750, 2009
[Non-Patent Document 3]
"Characteristic Evaluation of a Multilayered PVC Gel Actuator", Proceedings of the 9th SICE (the Society of Instrument and Control Engineers) System Integration Division Annual Conference, pp. 283-284, 2008
[Non-Patent Document 4]
"Development of Contraction-type PVC Gel Actuator", Proceedings of the 46th Hokuriku-Shinetsu Branch Regular Meeting of the Japan Society of Mechanical Engineers, pp. 415-416, 2009
[Non-Patent Document 5]
"Characteristics Evaluation of PVC Gel Actuators", The 2009 IEEE/RSJ International Conference on Intelligent Robots and Systems (IROS 2009), St. Louis, USA, pp. 2898-2903, 2009

SUMMARY OF INVENTION

Problem to be Solved by the Invention

A contraction-type gel actuator repeats a contracting state (or shrinking state) in which it contracts in its thickness direction and a returning state in which it restores to its original state when an ON-OFF operation of a voltage to be applied between electrodes is repeated. Thus, it can be used as an actuator having various actions such as a break, etc. by utilizing this effect. By the way, in addition to simply utilizing the contraction effect, it can also be used as a control element for high-precision control such as position control, etc. by controlling the contraction operation (expansion-contraction operation) with high accuracy. If highly accurate control in the contraction-type actuator becomes available, it could be used effectively for controlling the operation of robots or the like.

An object of the present invention is to provide a method for controlling with high accuracy operation of a contraction-type gel actuator so that the contraction-type gel actuator can be suitably used for a position control or the like.

Means for Solving Problem

A method for controlling a contraction-type gel actuator of the present invention is the method by controlling of a displacement in a thickness direction of the contraction-type gel actuator working on contraction in the thickness direction by applying a voltage between an anode and a cathode between which a gel including a dielectric polymeric material is interposed. The method comprises a step of performing a feedback control of an applied voltage E, with a sampled value of a displacement x when the applied voltage E is made to act on the contraction-type gel actuator. The step performs the feedback control of the applied voltage E. with the sampled value of the displacement x on a basis of the following equation (1):

$$E = kp(xd-x) + Ed \quad (1)$$

in the equation:
xd represents a target displacement of the contraction-type gel actuator;
Ed represents an applied voltage with respect to the target displacement xd obtained by linear approximation of the applied voltage and the displacement from a measured result of the displacement in accordance with the applied voltage of the contraction-type gel actuator; and
kp represents a proportional gain.

The contraction-type gel actuator is characterized in that the contraction-type gel actuator has a hysteresis characteristic in the relationship between the applied voltage and the displacement, when the applied voltage is gradually increased and then gradually lowered.

Further, the contraction-type gel actuator is characterized in that: the anode is formed into a mesh shape; the cathode is formed into a foil shape; on a surface and other surface of the cathode, the gel is respectively deposited so as to provide gel body; and the anode is interposed between thus gel bodies to form multiple layers by lamination thereof. Still further, the contraction-type gel actuator is characterized in that the gel comprises PVC and dibutyl adipate.

A control device of the present invention for controlling a displacement in a thickness direction of a contraction-type gel actuator working on contraction in the thickness direction by applying a voltage between an anode and a cathode between which a gel including a dielectric polymeric material is interposed, comprising; a displacement meter for measuring an amount of a displacement x in a thickness direction of the contractive-type gel actuator, and a computer for performing a feedback control of an applied voltage E, with a sampled value of the displacement x when the applied voltage E is made to act on the contraction-type gel actuator.

In the control device of the contraction-type gel actuator, the computer performs the feedback control of the applied voltage E, with the sampled value of the displacement x on a basis of the following equation (1):

$$E = kp(xd-x) + Ed \quad (1)$$

in the equation: xd represents a target displacement of the contraction-type gel actuator; Ed represents an applied voltage with respect to the target displacement xd obtained by linear approximation of the applied voltage and the displacement from a measured result of the displacement in accordance with the applied voltage of the contraction-type gel actuator; and kp represents a proportional gain. In the control device of the contraction-type gel actuator, the contraction-type gel actuator has a hysteresis characteristic in the relationship between the applied voltage and the displacement, when the applied voltage is gradually increased and then gradually lowered. In the control device of the contraction-type gel actuator, the anode is formed into a mesh shape; the cathode is formed into a foil shape; on a surface and other surface of the cathode, the gel is respectively deposited so as to provide gel body; and the anode is interposed between the thus gel bodies to form multiple layers by lamination thereof. In the control device of the contraction-type gel actuator, the gel comprises PVC and dibutyl adipate.

Effect of the Invention

According to the method for controlling the contraction-type gel actuator of the present invention, the displacement of the contraction-type gel actuator can be controlled with high accuracy.

The contraction-type gel actuator can be utilized as the control device for position control or the like.

EXPLANATIONS OF LETTERS OR NUMERALS

Figure 1:
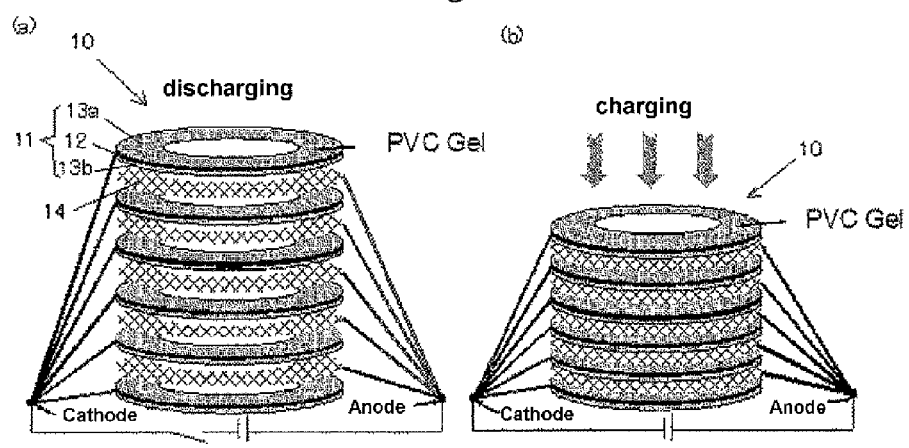
FIGS. 1 (a) and 1 (b) are explanatory diagrams showing a configuration and operation of a contraction-type gel actuator.

10: contraction-type actuator
11: gel body
12: electrode
13a, 13b: gel
14: mesh electrode
20: laser displacement meter
30: computer

MODE FOR CARRYING OUT THE INVENTION (Contraction-Type Gel Actuator)

FIGS. 1 (a) and 1 (b) show a configuration and effect of the contraction-type gel actuator to which the control method of the present invention is applied.

The contraction-type gel actuator 10 of this embodiment has a gel body 11 comprising; a foil-like electrode 12 on a surface and other surface of which gels 13a, 13b are deposited; and a mesh-like electrode 14, which is interposed between the layers of the gel bodies 11 to form multiple layers by lamination in the thickness direction. As shown in the Figure, the contraction-type gel actuator 10 has a circular ring-like electrode 12 so as to provide a communicating space at its central part, but the gel body 11 can be shaped into any shape such as a circular shape or the like.

FIG. 1 (a) shows a state in which voltage is not applied between the electrode 12 and the mesh electrode 14. FIG. 1 (b) shows a state in which voltage is applied. As shown in Figures, when the voltage is applied between the electrodes (the cathode 12 and the mesh anode 14), the contraction-type gel actuator 10 contracts (or shrinks) in the thickness direction (FIG. 1 (b)). When the voltage application is released, the thickness of the actuator is restored into its original thickness (FIG. 1 (a)). The contraction (or shrinkage) action of the contraction-type gel actuator 10 is caused by drawing or thrusting the gel into a gap in the mesh electrode 14 when voltage is applied, thereby the thickness of the actuator becomes thinner or the actuator is compressed.

As a gel that causes such action when an electric field is applied, a dielectric polymeric material such as polyvinyl chloride (PVC), polymethyl methacrylate, polyurethane, polystyrene, polyvinyl acetate, nylon 6, polyvinyl alcohol, polycarbonate, polyethylene terephthalate, polyacrylonitrile, etc. are known.

In the present embodiment, as the gel (13a, 13b), PVC that includes dibutyl adipate (DBA, a plasticizer) was used. Gel thickness was 0.6 to 1.0 mm.

In addition, a 0.01 mm thick stainless steel foil was used as the electrode 12. A stainless steel mesh with a wire diameter of 0.2 mm, mesh hall size of 1.1×1.1 mm and thickness of 0.4 mm was used as the mesh electrode 14.

The displacement in the thickness direction of the contraction-type gel actuator 10 increases with increase in the number of layers of the gel body 11. The contraction-type gel actuator 10 used in the following experiment had 8-layered gel bodies 11.

(Characteristics of Contraction-Type Gel Actuator)

When a voltage of 600V was applied, the contraction-type gel actuator of the present embodiment showed that the displacement rate was 10% or more, the response characteristic was about 7 Hz, and the generated actuator force was approximately 3 kPa at the time of contraction. It was also observed that stiffness of the actuator increased with the applied electric field.

Figure 2:
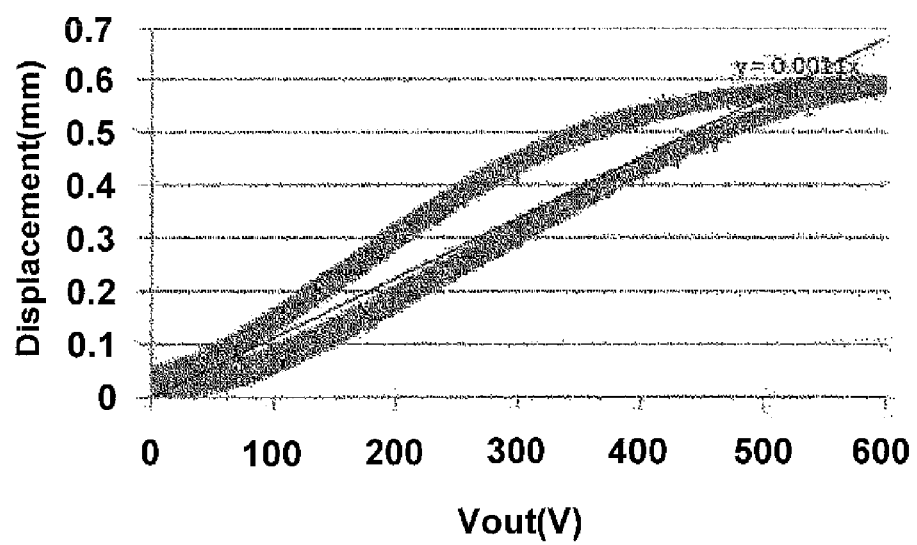
FIG. 2 is a graph showing measured results of the displacement in accordance with applied voltages of the contraction-type gel actuator.

FIG. 2 shows the result of measurement of the displacement (contraction displacement) in accordance with applied voltage of the contraction-type gel actuator described above. Measurement was conducted in such a manner that the applied voltage was continuously increased from 0V to 600V and then lowered, and the displacement of the gel actuator was measured using a laser displacement meter.

In this experiment, the length of time of one cycle in which voltage was increased from 0V to 600V and then lowered from 600V to 0V was 10 seconds. Even when the voltage was cyclically increased and lowered, almost identical hysteresis curves were obtained.

The graph shown in FIG. 2 indicates that there is a hysteresis characteristic between the voltage to be applied and the amount of the displacement. Two different amounts of displacement were observed between in a case where a continuously-increasing voltage was applied to the contraction-type gel actuator and in a case where a continuously-decreasing voltage was applied to the contraction-type gel actuator. The amount of displacement is not always constant even if same voltage is applied. That is, the contraction-type gel actuator showed a different amount of displacement according to its voltage application history.

In the actual contraction-type gel actuators, there are various factors involved in the characteristics of the actuators. Material, thickness, size and the number of layers of the gel body also affect the actuator's properties, so that the amount of displacement and hysteresis characteristics with respect to the applied voltage are considered to be different from each other. Such hysteresis characteristics of the contraction-type gel actuator were not what had been known. These characteristic effects have been newly found here.

In order to make the contraction-type gel actuators having various amounts of displacement and hysteresis characteristics with respect to an applied voltage available as control elements such as position control elements or the like which are required to control the displacement with high accuracy, such a simple control method as only applying voltage to cause a specific displacement is insufficient. Accordingly, when devising a control method, it is necessary to take it into account that it has the hysteresis characteristic.

Hereinafter, a method for position-controlling the contraction-type gel actuator having such hysteresis characteristics will be described.

(Feedback Control Method)

In the present invention, as a method of controlling the contraction-type gel actuator having such hysteresis characteristics, a voltage to be applied to the contraction-type gel actuator is feedback-controlled by applying a specific correction to the voltage based on a result obtained by measuring a displacement in the contraction-type gel actuator. In the present invention, the feedback control is performed on the basis of a control law shown in the following equation (1).

$$E = kp(xd - x) + Ed \quad (1)$$

$$Ed = xd/\alpha \quad (2)$$

Equation (2) represents an applied voltage Ed with respect to the target displacement xd, when the relationship between the applied voltage and the displacement is approximated into a linear relationship as shown in FIG. 2 that is obtained from the measurement results of the amount of displacement with respect to the applied voltage. α is a slope of the approximate linear line.

The first item of the equation (1) is a product of the proportional gain kp and the difference between the actual sampling displacement x and the target displacement xd. In this first item, a correction is applied to a voltage to be applied based on the difference between the target displacement and the actual displacement. The second item is a voltage to be applied to cause a target displacement calculated from the linear model. The second item is a so-called offset term.

Figure 3:
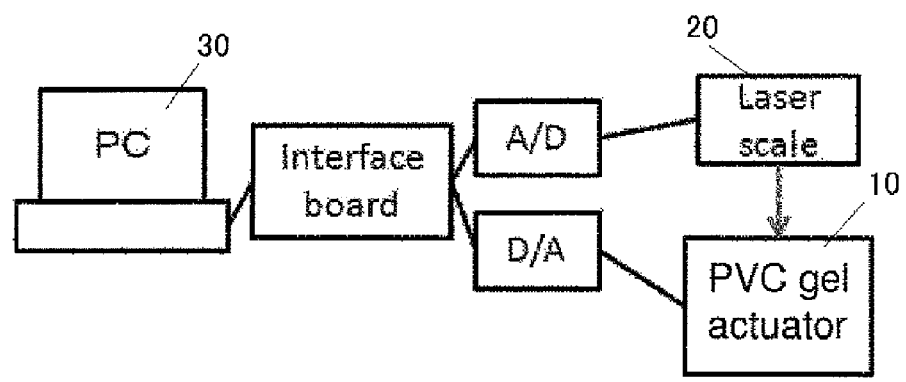
FIG. 3 is a block diagram of a control device for performing a feedback control of the contraction-type gel actuator.

FIG. 3 is a block diagram showing a control device for controlling the contraction-type gel actuator using a feedback control method described above.

In this control device, the amount of displacement of the contractive-type gel actuator 10 is measured using a laser displacement meter 20. The voltage to be applied to the contraction-type gel actuator 10 is calculated using a computer 30 based on the measurement results using the laser displacement meter 20. The calculated results are feed-backed to the contraction-type gel actuator 10 as the operation voltage.

(Experimental Result)

Figure 4:
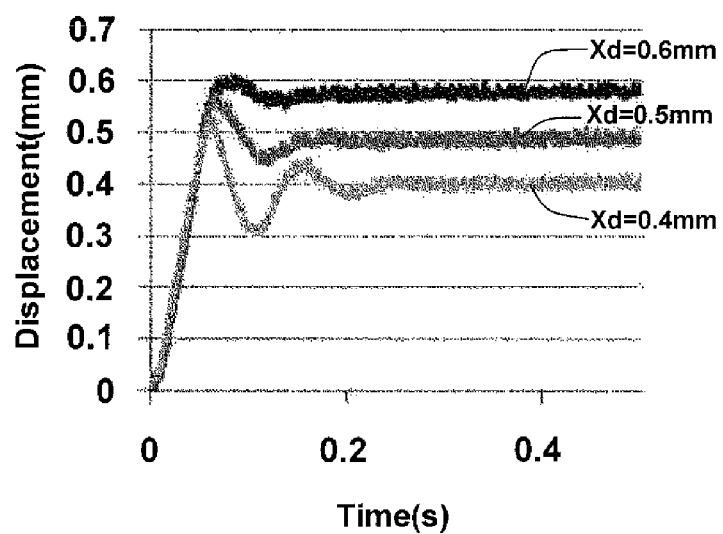
FIG. 4 is a graph showing transient characteristics of the displacement after the voltage is applied when the contraction-type gel actuator is feedback-controlled.

FIG. 4 shows the measurement results of the displacement of the contraction-type gel actuator, on condition that the target displacement of the contraction-type gel actuator was set to xd=0.4 mm, 0.5 mm or 0.6 mm and the feedback control was performed as described above. The feedback control was performed with a sampling time of 0.1 (ms) using the laser displacement meter.

For all of them, until the lapse of about 0.2 s from the start of the voltage application, a transient state in which the target displacement deviated was observed. But after the lapse of about 0.2 s, the deviation converged to the target displacement. Since then, the target displacement was maintained. The experimental results show that the feedback control method described above effectively functioned as a method to precisely control the displacement of the contraction-type gel actuator.

Figure 5:
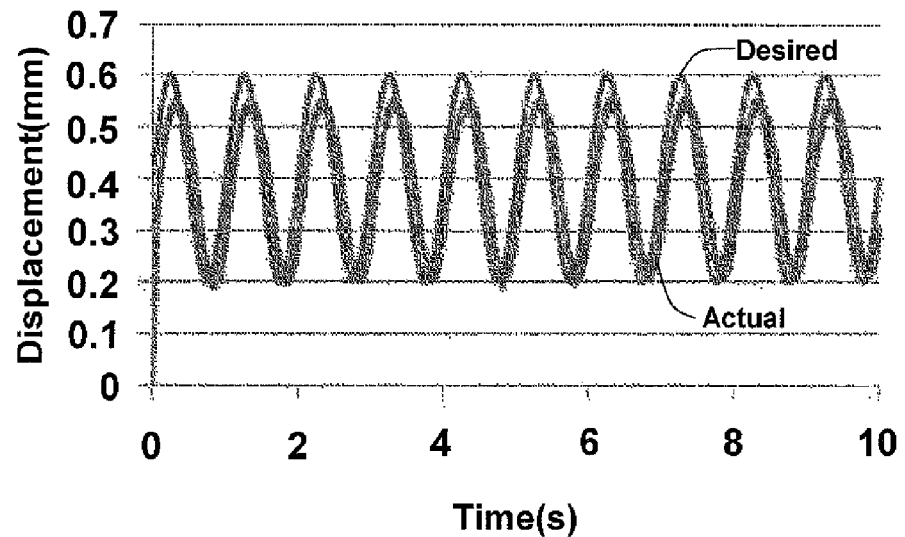
FIGS. 5 (a) and 5 (b) are graphs each showing an operation of the contraction-type gel actuator when the contraction-type gel actuator is open-loop-controlled (FIG. 5 (a)) and closed-loop-controlled (FIG. 5 (b)).
Figure 5:
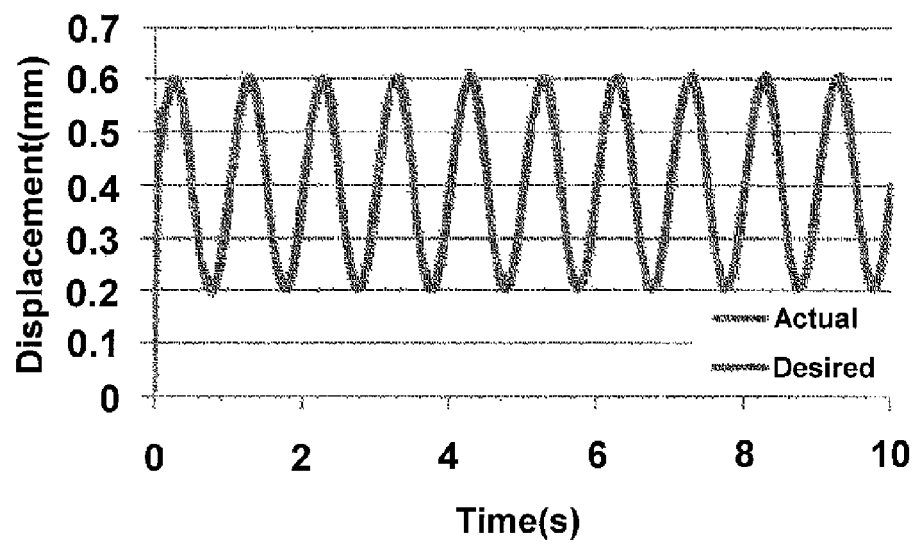

FIGS. 5 (a) and 5 (b) show the measurement results of the behavior of the gel actuator when the contraction-type gel actuator was periodically displaced (periodical expansion and contraction).

FIG. 5 (a) shows measurement results of a case in which a voltage was applied to a contraction-type gel actuator based on the open-loop control, i.e. a linear model so as to cause a target displacement.

The measurement results showed that for the target periodical displacement, the displacement behavior of the contraction-type gel actuator deviated from that of the target behavior. That is, the target periodical behavior was not perfectly achieved.

FIG. 5 (b) shows a case in which the contraction-type gel actuator was controlled based on a closed-loop control, i.e. the feedback control. The experimental results indicated that in this case, the behavior of the actuator completely matched the target periodical displacement.

FIGS. 5 (a) and 5 (b) indicate that the method to apply the feedback control mentioned above to the contraction-type gel actuator was very effective as a method to control the displacement of the contraction-type gel actuator.

Figure 6:
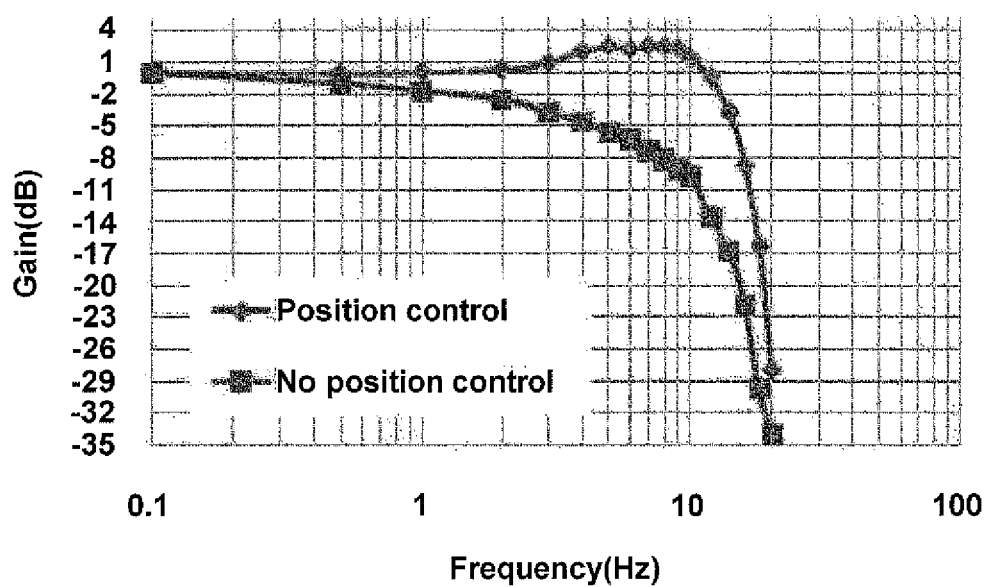
FIG. 6 is a graph showing a gain curve when the frequency of the voltage to be applied to the contraction-type gel actuator is changed.

FIG. 6 shows the measurement results of the relationship between a frequency and a gain when the frequency of the voltage to be applied to the contraction-type gel actuator (shown in FIG. 1) was changed.

The experimental results of FIG. 6 show that if the feedback control was not performed, there was a tendency that when the frequency of voltage exceeded 1 Hz, the gain was gradually decreasing with an increase in the frequency of the applied voltage. On the other hand, if the feedback control was performed, gain was not reduced until the frequency reached about 10 Hz, but the gain started decreasing when the frequency exceeded 10 Hz. The results of this experiment showed that the feedback control had a function to effectively improve the response characteristics of the contraction-type gel actuator.

The experimental results described above show that the method to perform the feedback control based on the control law described above was effective as a method to perform with high accuracy a position control of the contraction-type gel actuator having the hysteresis characteristic.

It is considered that the reason why the feedback control method of the present invention functions effectively for the high-precision position control described above is that the offset value (Ed) obtained by the linear approximation of the relationship between the applied voltage and the amount of displacement obtained by actual measurement is incorporated into the control law of the applied voltage (E) that is used to feedback-control the contraction-type gel actuator.

For those which have a hysteresis characteristic such as the contraction-type gel actuator of the present invention, formulation of an effective control law for the feedback control cannot be realized until an actual feedback control is performed. In a usual feedback control, a value based on the deviation from a target displacement is used as a correction term. But in the present invention, the feedback voltage is determined by adding the above mentioned offset value to this correction term. Accordingly, even if the contraction-type gel actuator has hysteresis characteristics, it has been found for the first time that the highly accurate feedback control can be performed. The effective functioning of the above mentioned feedback control in the contraction-type gel actuator may be achieved as follows. The gel actuator has a certain amount of elasticity, but the addition of the offset value is considered to effectively suppress a variation element caused from this elasticity, so that it is considered that the stable control could be realized.

In addition, the contraction-type gel actuator used for the present invention is not limited to the gel actuator having a laminated structure comprising: a mesh-like anode electrode 14; a foil-like cathode electrode 12; and a gel body 11 as the above-mentioned embodiments. For example, a gel actuator having a single layer of gel body 11, without using a plurality of gel bodies 11, can also be used. Further, a contraction-type gel actuator comprising: a gel on the surface of which convex-concave shapes are formed; a foil-like anode; and a foil-like cathode can also be used so that the electrodes contract.

What is claimed is:

1. A method for controlling a contraction-type gel actuator, the method comprising;
    applying a voltage E between an anode and a cathode between which a gel including a dielectric polymeric material is interposed;
    identifying a sampled value of a displacement x in a thickness direction of the contraction-type gel actuator working on contraction in the thickness direction; and
    performing a feedback control of the applied voltage E, based on the sampled value of the displacement x in response to the applying the voltage E.

2. The method for controlling the contraction-type gel actuator according to claim 1, wherein the step performs the feedback control of the applied voltage E, with the sampled value of the displacement x on a basis of the following equation (1):

$$E = kp(xd-x) + Ed \qquad (1)$$

in the equation:
xd represents a target displacement of the contraction-type gel actuator;
Ed represents an applied voltage with respect to the target displacement xd obtained by linear approximation of the applied voltage and the displacement from a measured result of the displacement in accordance with the applied voltage of the contraction-type gel actuator; and
kp represents a proportional gain.

3. The method for controlling the contraction-type gel actuator according to claim 1, wherein the contraction-type gel actuator has a hysteresis characteristic in the relationship between the applied voltage and the displacement, when the applied voltage is gradually increased and then gradually lowered.

4. The method for controlling the contraction-type gel actuator according to claim 1, wherein the anode is formed into a mesh shape; the cathode is formed into a foil shape; on a surface and other surface of the cathode, the gel is respectively deposited so as to provide gel body; and the anode is interposed between the thus gel bodies to form multiple layers by lamination thereof.

5. The method for controlling the contraction-type gel actuator according to claim 1, wherein the gel comprises PVC and dibutyl adipate.

6. A control device comprising;
    a displacement meter for measuring an amount of a displacement x in a thickness direction of the contractive-type gel actuator, and
    a computer for performing a feedback control of an applied voltage E, based on a sampled value of the displacement x in response to applying a voltage E between n anode and a cathode between which a gel including a dielectric polymeric material is interposed, thereby controlling displacement in a thickness direction of a contraction-type gel actuator working; on contraction in the thickness direction.

7. The control device of the contraction-type gel actuator according to claim 6, wherein the computer performs the feedback control of the applied voltage E, with the sampled value of the displacement x on a basis of the following equation (1):

$$E = kp(xd-x) + Ed \qquad (1)$$

in the equation:
xd represents a target displacement of the contraction-type gel actuator;
Ed represents an applied voltage with respect to the target displacement xd obtained by linear approximation of the applied voltage and the displacement from a measured result of the displacement in accordance with the applied voltage of the contraction-type gel actuator; and
kp represents a proportional gain.

8. The control device of the contraction-type gel actuator according to claim 6, wherein the contraction-type gel actuator has a hysteresis characteristic in the relationship between the applied voltage and the displacement, when the applied voltage is gradually increased and then gradually lowered.

9. The control device of the contraction-type gel actuator according to claim 6, wherein the anode is formed into a mesh shape; the cathode is formed into a foil shape; on a surface and other surface of the cathode, the gel is respectively deposited so as to provide gel body; and the anode is interposed between the thus gel bodies to form multiple layers by lamination thereof.

10. The control device of the contraction-type gel actuator according to claim 6, wherein the gel comprises PVC and dibutyl adipate.

* * * * *